United States Patent [19]

Hayama et al.

[11] Patent Number: 4,611,344
[45] Date of Patent: Sep. 9, 1986

[54] ELECTRONIC VOLUME CONTROL CIRCUIT

[75] Inventors: Akira Hayama; Shinichi Suzuki, both of Saitama, Japan

[73] Assignee: Pioneer Electronic Corporation, Tokyo, Japan

[21] Appl. No.: 679,436

[22] Filed: Dec. 7, 1984

[30] Foreign Application Priority Data

Dec. 7, 1983 [JP] Japan .................... 58-189796[U]

[51] Int. Cl.⁴ .............................................. H03G 1/02
[52] U.S. Cl. .................................... 381/108; 381/109
[58] Field of Search .............. 381/108, 107, 109, 102; 455/200, 234, 232; 328/168; 84/1.26, 1.27

[56] References Cited

U.S. PATENT DOCUMENTS 4,178,826 12/1979 Hiyoshi et al. .................... 84/1.26
4,390,834 6/1983 Ohshita ............................... 381/109
4,479,237 10/1984 Sugasawa ....................... 381/107 X Primary Examiner—James L. Dwyer
Attorney, Agent, or Firm—Sughrue, Mion, Zinn, Macpeak & Seas

[57] ABSTRACT

An electronic volume control circuit in which the volume setting can be finely controlled, regardless of the level of the input signal, and the output sound level can be rapidly changed. A digital signal is produced indicative of either the duration of up and down instruction signals or a number of times of occurrence of the up or down instruction signals. This digital signal is decoded in accordance with a look-up table to produce data indicative of an increase or decrease width of the volume data. An arithmetic circuit operates in response to the output of the decoder to increase or decrease the volume data according to the up and down instruction signals, and the attenuation or amplification of the input signal is established accordingly.

4 Claims, 6 Drawing Figures

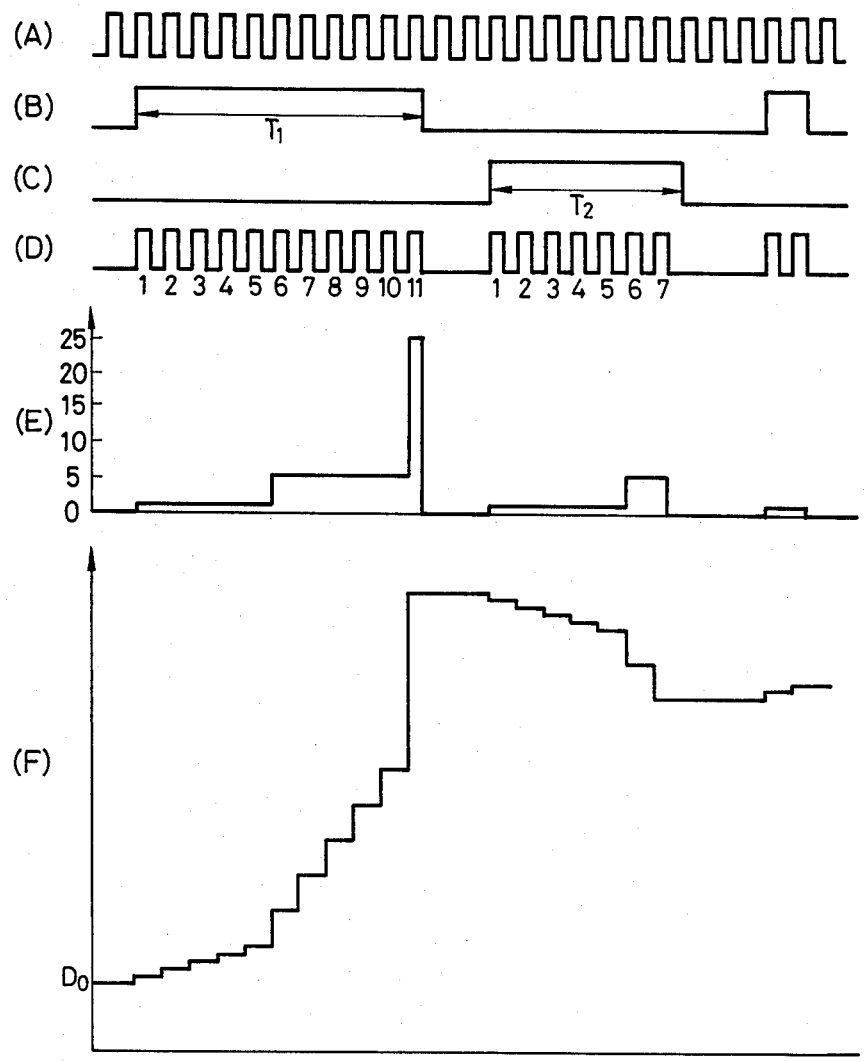

ELECTRONIC VOLUME CONTROL CIRCUIT

BACKGROUND OF THE INVENTION

The present invention relates to electronic volume control circuits, and more particularly to an electronic volume control circuit for controlling the level of an audio signal or the like in response to a digital signal.

A conventional device of this type is shown schematically in FIG. 1. As shown in FIG. 1, first terminals of an up switch 1 and a down switch 2 are connected to a power source $+V_{DD}$, and second terminals thereof are grounded through resistors 3 and 4 and connected to respective input terminals of a two-input OR gate 5. The output of the OR gate 5 is applied to an AND gate 7 so that clock pulses produced by a clock pulse generator 6 pass through the AND gate 7. The clock pulses passing through the AND gate 7 are applied to an up-down counter 8, the up-down control of which is established by the output of the up switch 1.

The content of the counter 8 is applied as volume indicating data to a volume setting circuit 10 through a correction circuit 9. In the volume setting circuit 10, according to the applied volume data, an audio input signal is controlled in level.

When, for instance, the up switch 1 is depressed, the counter 8 receives clock pulses for the period that the up switch 1 remains depressed. In this case, the counter 8 performs an incrementing operation. Therefore, the number of clock pulses received is added to the present count value of the counter and the resultant count value is outputted as a digital signal. The digital signal is suitably corrected by the correction circuit 9 to provide volume data for the volume setting circuit 10.

With the above-described electronic volume control circuit, when the average level of the input signal changes, the available volume step sizes provided by the circuit may not allow for a comfortable listening level. More specifically, the electronic volume circuit is so designed that the volume step size is made small in the range of attenuation of −20 dB to −40 dB, which corresponds to an ordinary listening level for an ordinary input signal level, and is made large in other ranges. Accordingly, in the conventional circuit, the volume is controlled with a predetermined variation width irrespective of the magnitude of the input signal. Therefore, in the case where, for instance, because of a low level input signal, the electronic volume control circuit is used outside of the above ordinary range, the available step size for varying the volume becomes large, making it difficult to set the volume at a comfortable listening level.

SUMMARY OF THE INVENTION

An object of the invention is thus to eliminate the above-described difficulties accompanying a conventional electronic volume control circuit. More specifically, an object of the invention is to provide an electronic volume control circuit which provides excellent control over the output sound volume over the entire range of volume levels.

Provided by the invention is an electronic volume control circuit in which addition and subtraction of digital data are performed according to up and down instruction signals, respectively, and volume control of a predetermined signal is performed using volume data provided according to the result of the addition or subtraction, which circuit, according to the invention, comprises: means for producing a digital signal according to the duration of an up or down instruction or the number of up or down instructions; decoding means for converting the digital signal into data indicating an increase or decrease in the width of the volume data according to a predetermined conversion rule; and arithmetic means operating in response to an output of the decoding means to increase or decrease the volume data according to the up and down instructions, results of calculations of the arithmetic means being utilized for volume control.

BRIEF DESCRIPTION OF THE DRAWINGS

FIG. 3 is a diagram showing a conversion table for a decoder shown in FIG. 2;

FIG. 4 is a waveform diagram for a description of the operation of the circuit of FIG. 2;

DESCRIPTION OF THE PREFERRED EMBODIMENTS

Figure 1:
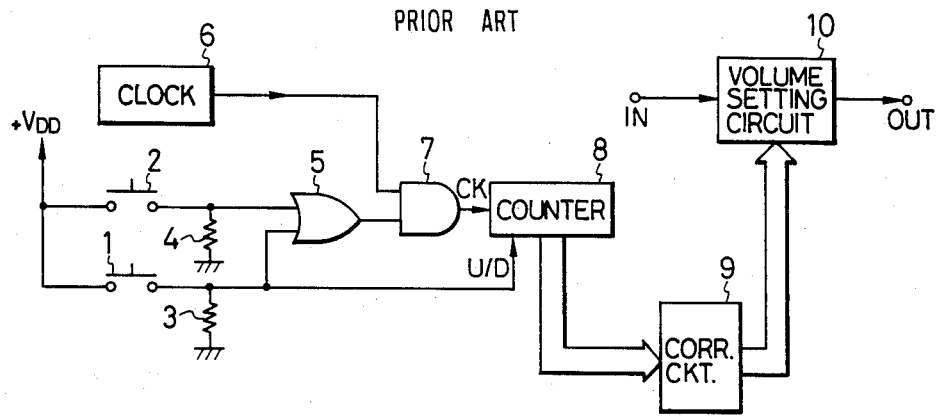
FIG. 1 is a block diagram showing a conventional electronic volume control circuit.
Figure 2:
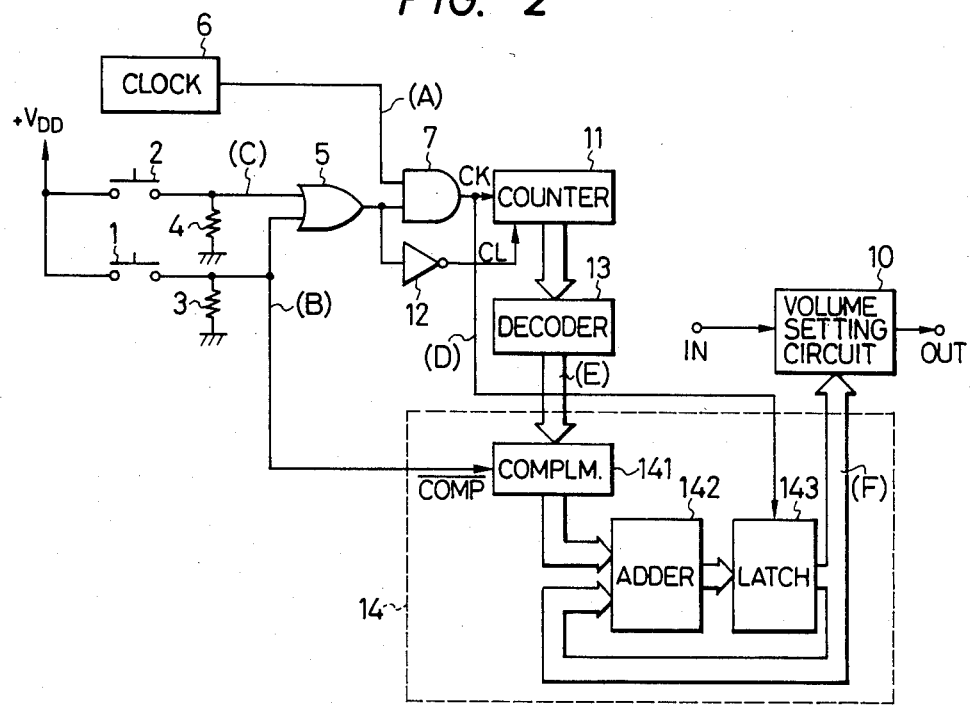
FIG. 2 is a block diagram showing a preferred embodiment of a volume control circuit of the invention.

A preferred embodiment of the invention will be described with reference to FIG. 2. In FIG. 2, those components which have been previously described with reference to FIG. 1 are therefore designated by the same reference numerals or characters.

The instruction output (B) of the up instruction switch 1 and the instruction output (C) of the down instruction switch 2 are applied to the two-input OR gate 5, the output of which is a gate signal for a clock pulse (A). Clock pulses (D) which pass through the AND gate 7 are applied to a counter 11. The output of the gate 5 is applied through an inverter 12 to the counter 11 to reset the latter. That is, the content of the counter 11 is reset whenever the switch 1 or 2 is operated. The output of the counter 11 is applied to a decoder 13 where it is converted into data (E), according to predetermined conversion rules, which indicates a volume increase or decrease width (described below in more detail).

According to the data (D), the volume data (F) is increased or decreased by an arithmetic circuit 14. The arithmetic circuit 14 includes a complementer 141 for selectively outputting the complement of an output (E) of the decoder or the output (E) uncomplemented, an adder 142 for adding the output of the complementer 141 to the output (F) of a latch circuit 143, and the latch circuit 13 for latching the output of the adder 142. The output (F) of the latch circuit 143 is the aforementioned volume data used to perform volume control in the volume setting circuit 10.

FIG. 3 is a conversion table indicating the relationships between the inputs and outputs of the decoder in FIG. 2. When the count value of the counter 11 is in the range of 1 to 5, the volume increase or decrease step width (variation width) is "1". When the count value of the counter 11 is in the range of 6 to 10, the variation width is "5". Similarly, when the count value is higher than 10, the variation width is "25".

FIG. 4 is a timing chart for a description of an example of the operation of the circuit in FIG. 2 according to the conversion table in FIG. 3. In FIG. 4, parts (A) through (F) show the signals (A) through (F), respectively, in the circuit in FIG. 2. It is assumed that the up switch is held depressed for a period of time $T_1$ as shown in part (B) of FIG. 4. In this case, eleven clock pulses (D) are applied to the counter 11. In the decoder 13, the volume variation width is outputted according to the conversion table shown in FIG. 3, and therefore, for the first five (5) clock pulses, the variation width data is "1" as indicated in part (E) of FIG. 4. When the latch circuit 143 performs a latch operation in synchronization with the clock pulse, the adder 142 adds "1" to the initial latch value of the latch circuit 143 whenever each of the first five clock pulses is applied to the counter 11, thus increasing the volume data by one step for each of the first five clock pulses, as shown in part (F) of FIG. 4.

For the sixth to tenth clock pulses, the variation width data of the decoder 13 is "5", and therefore the volume data increases by five steps for each of the sixth to tenth clock pulses. For the eleventh clock pulse, the variation width data of the decoder 13 is "25", and therefore the volume data increases by twenty-five steps.

When the down switch 2 is subsequently depressed for a period of time $T_2$, seven clock pulses are applied to the counter 11. For the first to fifth clock pulses, the variation width data is "1". In this case the complementer 141 is activated to apply the complement of the variation width data "1" to the adder 142. Therefore, the present latch data of the latch circuit 143 is decreased by one step for each of the five clock pulses. For the sixth and seventh clock pulses, the variation width data is "5", and therefore the volume data (F) is decreased by five steps for each of the sixth and seventh clock pulses.

The above-described operation is carried out in the same way no matter what level the volume or input signal may take at the start of the volume control operation. Accordingly, fine adjustment can be performed over the entire volume level range, and the volume level can be quickly changed to a value much different from the present setting.

Figure 5:
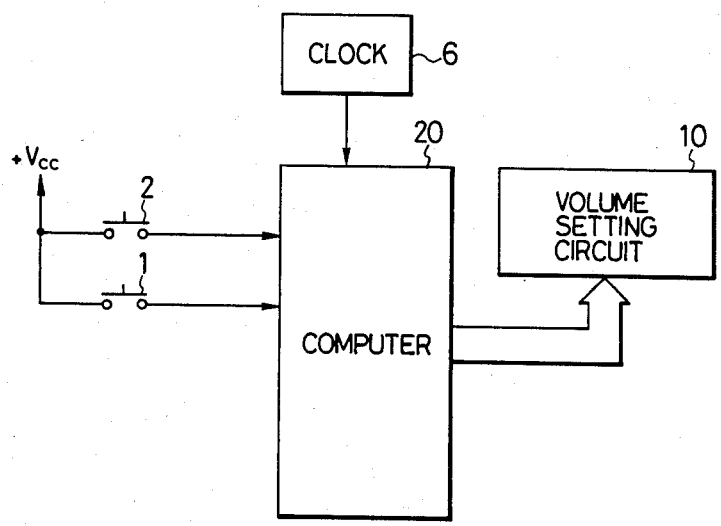
FIG. 5 is a block diagram showing another embodiment of the invention.
Figure 6:
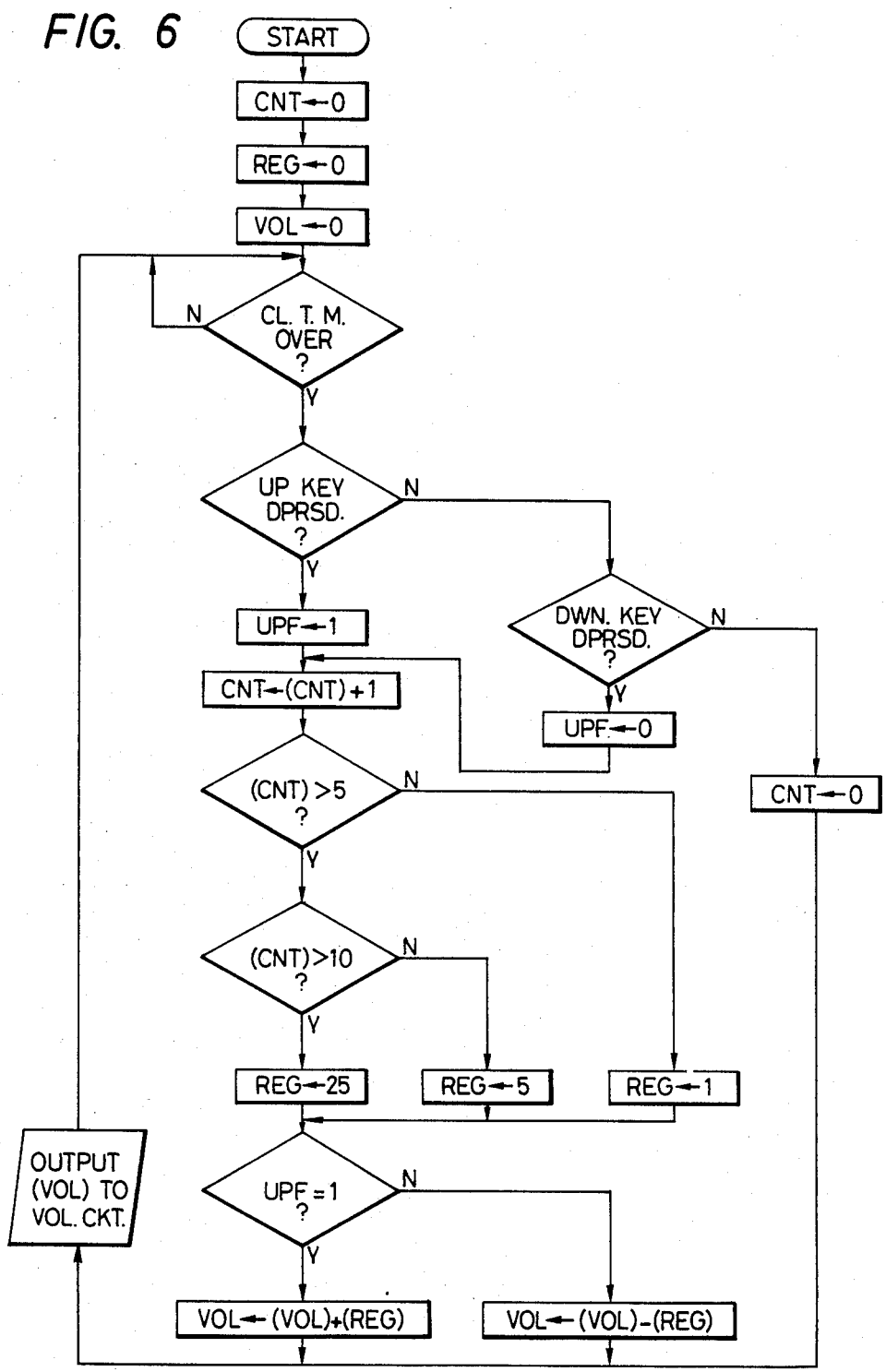
FIG. 6 is a flow chart for the device shown in FIG. 5.

FIG. 5 is a block diagram showing another embodiment of the present invention in which a computer 20 is employed instead of the gates 5, 7 and 12, the counter 11, the decoder 13, and the arithmetic circuit 14 in FIG. 2. FIG. 6 is a flow chart for this embodiment. In FIG. 6, CNT designates a clock count content (corresponding to the counter 11 in FIG. 2); UPF, an up/down switch flag produced in response to an up/down switch instruction; REG, an operation register's content; and VOL, a volume data memory's content. This embodiment also operates using the table shown in FIG. 3. However, it should be noted that FIG. 3 shows only an example and that various changes may be made as the situation demands. For instance, the decoding for up-counting may be different from that for down-counting.

In the above-described embodiments, clock pulses are inputted to the counter for the period of time that the switch is depressed; however, a modification is contemplated whereby the number of times the switch is depressed is counted by the counter and the count value of the counter is decoded.

As is apparent from the above description, in the electronic volume circuit of the invention, the volume variation width is determined according to the duration of the depression of a control key or the number of times the key depressed. Therefore, fine adjustment can be made over the entire volume level range, and the volume level can be changed quickly to a value much different from the present value.

We claim:
1. An electronic volume control circuit in which addition and subtraction of digital data are carried out according to up and down instruction signals, respectively, and volume control of a predetermined signal is performed with volume data produced according to results of said addition or subtraction, said volume control circuit comprising:
   means for producing a digital signal indicative of one of a duration of said up or down instruction signal and a number of instances of said up or down instruction signal;
   decoding means for converting said digital signal into data indicative of a step size of an increase or decrease of said volume data, according to a predetermined conversion table; wherein the values in the predetermined conversion table are non-linear with respect to the valve of the digital signal;
   arithmetic means operating in response to an output of said decoding means for increasing and decreasing said volume data, by an amount equal to said step size determined by said decoding means, according to said up and down instruction signals, respectively; and
   means for setting a volume of said predetermined signal in response to a result of calculation produced by said arithmetic means.

2. The electronic volume control circuit of claim 1, wherein said means for producing a digital signal comprises a counter for counting clock pulses of a predetermined frequency.

3. The electronic volume control circuit of claim 1, wherein said decoding means comprises a look-up table containing output values, indicative of a variation width of said volume data, which increases in a nonlinear manner with an increase in the value of said digital signal.

4. The electronic volume control circuit of claim 1, wherein said arithmetic means comprises a complementer having a data input port coupled to an output of said decoder and a control input controlled by a predetermined one of said up and down instruction signals, and adder having a first input port coupled to an output of said complementer, and a latch having an input port coupled to an output port of said adder and an output port coupled to a second input port of said adder.

* * * * *